(12) United States Patent
Metsis

(10) Patent No.: US 8,778,734 B2
(45) Date of Patent: Jul. 15, 2014

(54) TREE BASED ADAPTIVE DIE ENUMERATION

(75) Inventor: Sophocles R. Metsis, Wakefield, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 171 days.

(21) Appl. No.: 13/432,602

(22) Filed: Mar. 28, 2012

(65) Prior Publication Data

US 2013/0257481 A1    Oct. 3, 2013

(51) Int. Cl.
*H01L 21/50* (2006.01)
*H01L 23/48* (2006.01)

(52) U.S. Cl.
USPC ........... 438/109; 438/107; 438/455; 257/777; 257/778; 257/532

(58) Field of Classification Search
USPC ......... 257/777, 778, 303, 306, 414, 532, 686; 438/15, 107, 109
See application file for complete search history.

(56) References Cited

U.S. PATENT DOCUMENTS

| | | | |
|---|---|---|---|
| 5,963,464 A | 10/1999 | Dell et al. | |
| 6,269,411 B1 | 7/2001 | Reasoner | |
| 6,469,375 B2 | 10/2002 | Beausoleil et al. | |
| 6,734,474 B2 | 5/2004 | Frankowsky | |
| 6,913,471 B2 | 7/2005 | Smith | |
| 7,111,149 B2 * | 9/2006 | Eilert | 711/220 |
| 7,123,497 B2 | 10/2006 | Matsui et al. | |
| 7,494,846 B2 * | 2/2009 | Hsu et al. | 438/109 |
| 8,399,298 B2 * | 3/2013 | Wu | 438/109 |
| 2006/0206745 A1 | 9/2006 | Prengel et al. | |

FOREIGN PATENT DOCUMENTS

DE    10059024    8/2001

OTHER PUBLICATIONS

Translation of Official Communication, Application No. 10 2005 011 369.9-53. Dec. 27, 2005.
74F283 Data Sheet dated Apr. 1988, revised Jan. 2004. Retrieved from www.fairchildsemi.com.
International search report application No. DE 10 2005 011 369.9-53 issued Jan. 18, 2007.
Translation of Official Communication in German Application No. 10 2005 011 369.9-53 issues Jun. 11, 2007.

* cited by examiner

*Primary Examiner* — Vibol Tan
(74) *Attorney, Agent, or Firm* — Rory D. Rankin; Meyertons, Hood, Kivlin, Kowert & Goetzel, P.C.

(57) ABSTRACT

A system and method for efficiently addressing dies in a three-dimensional stacked integrated circuit. Multiple stacked dies may be included in a single package or module. At least two of the dies are vertically stacked. One or more of the dies may include die enumeration logic that generates a unique die address space identifier (ID) for a particular die. Unless a die is a base die, each die receives a unique die ID for itself from a die placed below itself. The die then generates a unique die ID for one or more dies placed above itself and sends these die IDs to the dies located on top of itself. If a die is a base die, then the logic may receive a root value for a first unique die ID within the vertical stack from the package substrate or silicon based interposer beneath it.

17 Claims, 9 Drawing Sheets

TREE BASED ADAPTIVE DIE ENUMERATION

BACKGROUND

1. Field of the Invention

This invention relates to computing systems, and more particularly, to efficiently addressing dies in a three-dimensional stacked integrated circuit.

2. Description of the Relevant Art

As both semiconductor manufacturing processes advance and on-die geometric dimensions reduce, semiconductor chips provide more functionality and performance. However, design issues still arise with modern techniques in processing and integrated circuit design that may limit potential benefits. One issue is that interconnect delays continue to increase per unit length in successive generations of two-dimensional planar layout chips. Also, high electrical impedance between individual chips increases latency. In addition, signals that traverse off-chip to another die may significantly increase power consumption for these signals (e.g., by 10 to 100 times) due to the increased parasitic capacitance on these longer signal routes.

Progress has been made in three-dimensional integrated circuits (3D ICs) that utilize die-stacking technology to allow two or more layers of active electronic components to be integrated both vertically and horizontally into a single circuit. Die-stacking technology is a fabrication process that enables the physical stacking of multiple separate pieces of silicon (integrated chips) together in a same package with high-bandwidth and low-latency interconnects. The 3D packaging saves space by stacking separate chips in a single package and provide high-density, low-capacitance interconnects compared to traditional two-dimensional planar wire-bonds.

Similar to other microelectronic products, the 3D packaging is tested for manufacturing and design defects. A test architecture, such as the Joint Test Action Group (JTAG) boundary scan architecture, may be used to transport test data and control signals. In a post-bond stack situation, the external input/output (I/O) signals are typically located on the bottom die. Therefore, the test vectors and responses for each of the middle and top dies may need propagate through all dies below it.

Unique addresses may be used to distinguish one die from another within the 3D package during testing. However, due to different product configurations and the fact a given die may be re-used in different configurations, poses difficulties. Additionally, different dies within a 3D package may have their own technologies and design architecture approaches and die enumeration method for testing that assigns, or enumerates, unique addresses cannot modify these approaches. Preferably, the die enumeration method consistently provides unique addresses despite configuration changes both horizontally and vertically. Current die enumeration methods are not sufficiently adaptive to handle these characteristics.

In view of the above, efficient methods and systems for efficiently addressing dies in a three-dimensional stacked integrated circuit are desired.

SUMMARY OF EMBODIMENTS

Systems and methods for efficiently addressing dies in a three-dimensional stacked integrated circuit are contemplated. Multiple stacked dies may be included in a single package or module. Silicon interposers, through silicon vias (TSVs) and other mechanisms may be used to vertically stack and electrically connect two or more dies. At least two of the dies are vertically stacked. One or more of the dies may include die enumeration logic that may generate a unique die address space identifier (ID) for a particular die. In one embodiment, each die receives a unique die ID for itself from a die placed below it unless it is a base die. The die then generates a unique die ID for one or more dies placed above it and sends these die IDs to the dies located on top of it. The logic may be used in any product configuration.

In one embodiment, the logic detects whether its corresponding die is a bottom, or base, die of a vertical stack of dies that is connected to a package substrate, rather than connected to another die below it. If its corresponding die is a base die, then the logic will receive the root die ID from the package substrate or a passive silicon interposer beneath it. Otherwise, the logic may receive a unique die ID from a die below it. The selected or the received unique die ID may be assigned to the die comprising the logic.

Additionally, the logic may generate at least one other unique die ID based on at least the unique assigned die ID. In one embodiment, the logic may alter the assigned unique die ID in a manner that is based at least in part on a number of dies placed above it. If multiple dies are placed on top of the die comprising the logic, then the logic may generate unique die IDs for the remaining dies using other operations. One example of another operation is an increment of a most recent generated unique die ID. For multiple towers of stacked dies, a particular root value may be selected for a unique die ID for each base die within the multiple towers. The root values may be selected in a manner to ensure no address aliasing occurs when die IDs are generated by the control logic based on the root values.

These and other embodiments will be further appreciated upon reference to the following description and drawings.

Figure 1:
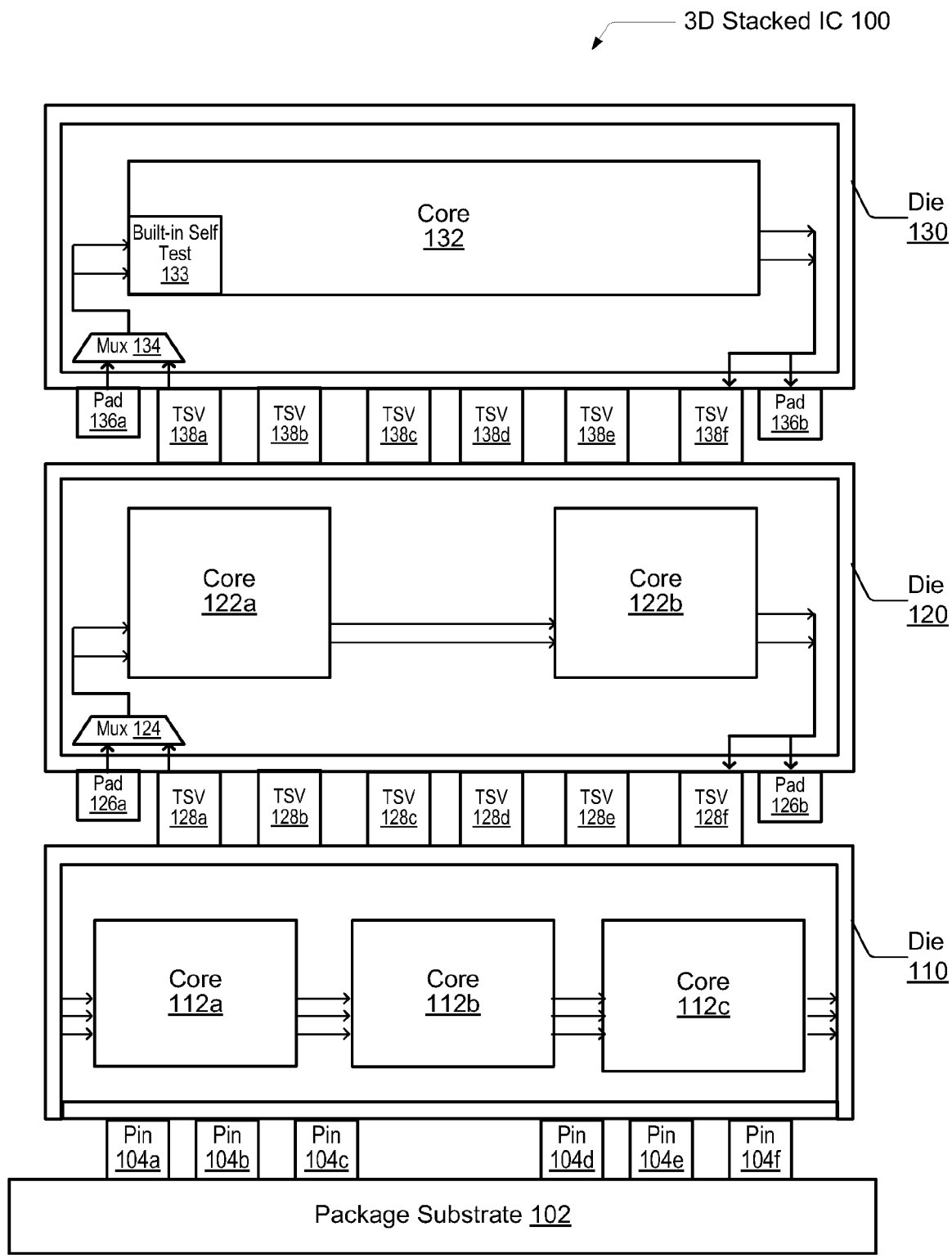
FIG. 1 is a generalized block diagram of one embodiment of a three-dimensional stacked integrated circuit (3D SIC).

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the spirit and scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention.

Referring to FIG. 1, a generalized block diagram of one embodiment of a three-dimensional stacked integrated circuit (3D SIC) 100 is shown. The 3D SIC 100 may be a system-in-package (SiP), a multi-chip module (MCM), or other type of packaged product. As shown, the 3D SIC 100 may include one or more dies 110-130 within a single package or module. Although three dies are shown, another number of dies may be selected. In some embodiments, the dies 110-130 have a same microarchitecture. However, in various other embodiments, at least two of the dies within the 3D SIC 100 have microarchitecture designs distinct from other dies within 3D SIC 100. In various embodiments, the dies 110-130 may be used to form a system-on-a-chip (SOC).

As shown, the dies 110-130 are integrated vertically, wherein two or more layers of active electronic components are integrated into a single circuit. One or more additional dies (not shown) may be integrated horizontally with one or more of the dies 110-130. The components within these layers communicate using on-chip signaling, whether vertically or horizontally. This signaling provides reduced interconnect signal delay over known two-dimensional planar layout circuits. For testing and debugging of the dies 110-130, a particular access solution may adaptively assign a unique die address space ID to each die of the stacked dies 110-130 regardless of configuration. Die enumeration logic may be included in one or more of the dies 110-130 to perform the adaptive assignments.

Each of the dies 110-130 may include one or more cores. For example, the die 110 includes cores 112a-112c, the die 120 includes cores 122a-122b and the die 130 includes the core 132. One or more of the dies 110-130 may be a general-purpose microprocessor, which may also be referred to as a central processing unit (CPU); a graphics processing unit (GPU), an accelerated processing unit (APU), a digital signal processor (DSP), a field programmable gate array (FPGA), a cache memory, a dynamic random access memory (DRAM), or other. The 3D SIC 100 may be a computing system that communicates with other chips on a printed circuit board within a mobile computer, a smart phone, or a tablet; a desktop; a server; or other.

The 3D SIC 100 may provide high density and heterogeneous semiconductor technology integration in a module or a package. Minimum system board real estate may be used to support the 3D SIC 100, such as an area occupied by the package substrate 102 on a printed circuit board. Multiple microelectronic packaging approaches may be used to provide the signaling between the dies 110-130. One approach is flip chip packaging, wherein a first die is flipped and attached to the top of a second die.

Bonding areas are created on each die for flip chip technology. Micro-bumps, which are typically copper, are grown to create the die-to-die interconnect. However, when thermal expansion is not matched between components and/or the PCB 102, the connections may crack. Additionally, as interconnect density increases, the cost of fabricating finer pitch substrate increases significantly. The pins 104a-104f may be flip chip or C4 (Controlled Collapse Chip Connection) bump connections. Below the package substrate 102, ball grid array (BGA) surface mount connections may be used to connect the packet to a printed circuit board (PCB).

Through silicon via (TSV) technology offers another microelectronic packaging approach. This approach provides high interconnect densities with relative shorter interconnect lengths. The TSVs 128a-128f may be used to provide interconnect signals between dies 110 and 120. The TSVs 138a-138f may also be used to provide interconnect signals between dies 120 and 130. In some embodiments, the TSVs 128a-128f are distinct from TSVs 138a-138f. In other embodiments, the TSVs 128a-128f are the same interconnect signals as the TSVs 138a-138f. A brief description of these two uses follows below. However, a further description of the TSVs is first provided.

The TSV technology uses a via that begins at a front side of a wafer by typically connecting to one of the lower metal layers and goes through the wafer and out the back. A hole may be formed into the wafer, lined with an insulator, and then filled with copper or tungsten. The wafer may be thinned to expose the backside of the TSVs. Chemical mechanical polishing (CMP) may be used to thin the wafer, which is a similar process as planarization between metal layers in a typical semiconductor process.

In some embodiments, the stacked dies 110-130 are wired together along their edges. The edge wiring may slightly increase the length and width of the package. The increased dimensions may utilize an extra silicon interposer between the dies. In this case, the TSVs 128a-128f are distinct from TSVs 138a-138f.

Figure 2:
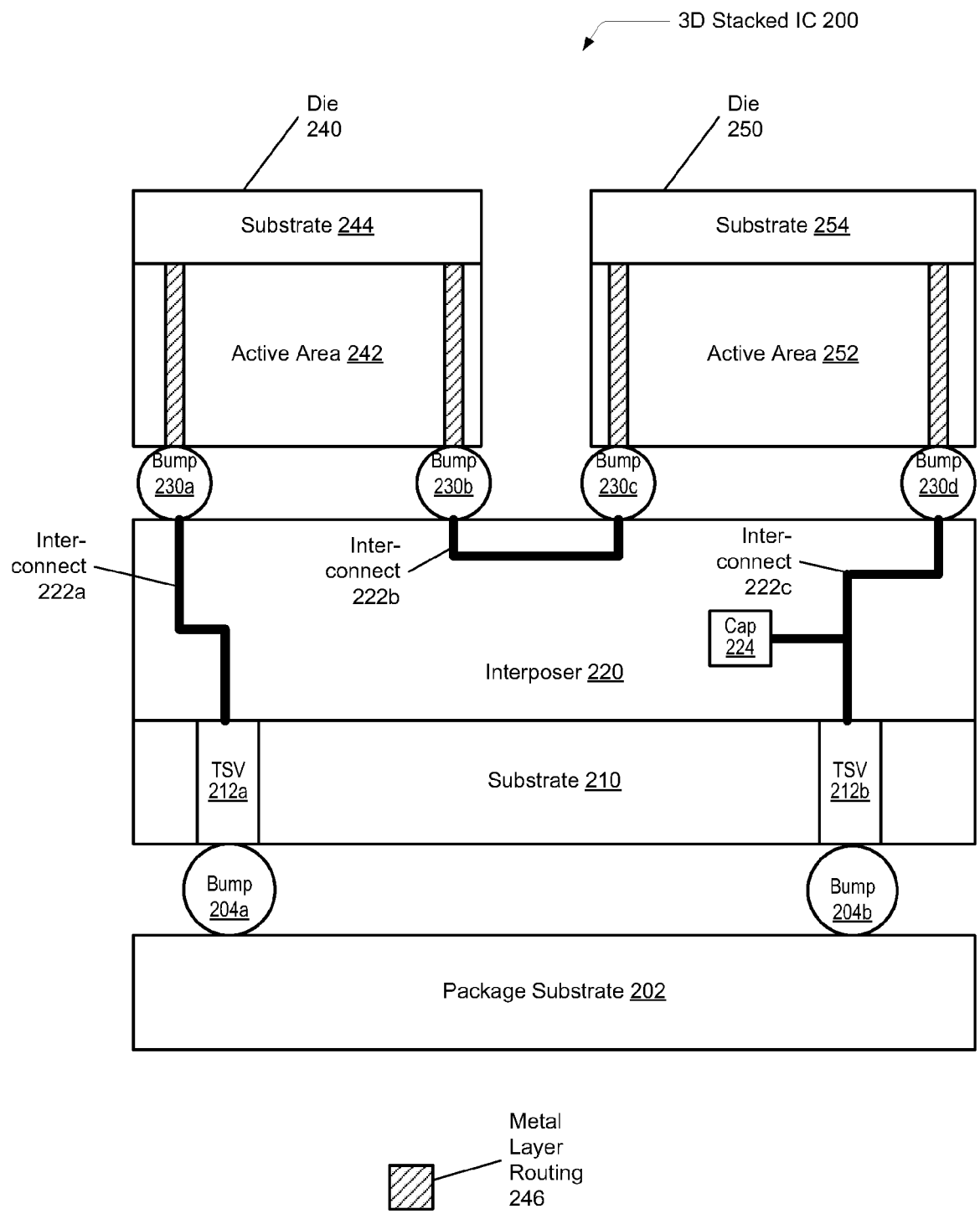
FIG. 2 is a generalized block diagram of another embodiment of a stacked integrated circuit.

Before continuing with a description of the 3D SIC 100, a further description of a 3D SIC utilizing a silicon interposer is provided. Referring to FIG. 2, a generalized block diagram of one embodiment of a three-dimensional stacked integrated circuit (3D SIC) 200 using a silicon interposer is shown. In various embodiments, a package substrate 202 is connected to a silicon substrate 210 through C4 bumps 204a-204b. The silicon substrate 210 has TSVs 212a-212b running through it. The TSVs 212a-212b provide interconnect signals between the package substrate 202 and the silicon interposer 220.

The silicon interposer 220 does not contain active transistors. Rather, the silicon interposer 220 includes interconnects and possibly decoupling capacitors. The dies 240-250 are attached to the interposer 220 by flipping them. The flipped dies 240-250 have the active areas 242 and 252 available for routing and therefore TSVs are not created to route signals above the bumps 230a-230d. For embodiments with edge wiring and silicon interposers, the active areas of the dies 240-250 do not utilize TSVs. Therefore, the active areas 242 and 252 may be manufactured without TSV exclusion zones and TSV threshold shift effects. The active areas 242 and 252 may be micro bumped as shown, since the dies 240 and 250 are not conventionally wire-bonded out.

The silicon interposer 220 may contain interconnect signals 222a-222c and one or more decoupling capacitors, such as cap 224. In some embodiments, the interconnect signals 222a and 222c are continuations of the TSVs 212a and 212b, respectively. Both the silicon substrate 210 and the silicon interposer 220 may have flat, smooth surfaces that support fine wiring. The silicon interposer 220 may have a same coefficient of thermal expansion (CTE) as silicon devices. Therefore, the silicon interposer 220 may provide both a high reliability for bump connection, such as the solder bumps 230a-230d, and support for fine pitched external wiring for the dies 240 and 250.

The bumps 230a-230d provide interconnects between the silicon interposer 220 and the edges of the active areas 242 and 252 of dies 240 and 250. In one embodiment, the bumps 230a-230d are connected to metal pads (not shown) and fine pitched wiring routes signals from the metal pads to the dies 240 and 250. The metal layer routing 246 continues the routing of the interconnect signals received from the interposer 220 for active silicon devices within the dies 240 and 250. Additional dies may be stacked on top of each of the dies 240 and 250 by repeating the layering shown from the silicon substrate 210 to the dies 240 and 250, wherein the repeating of the layering begins with the silicon substrates 244 and 254. Other uses and layering methods utilizing a silicon interposer are possible and contemplated. For example, an inorganic-organic hybrid substrate method may be used.

Figure 3:
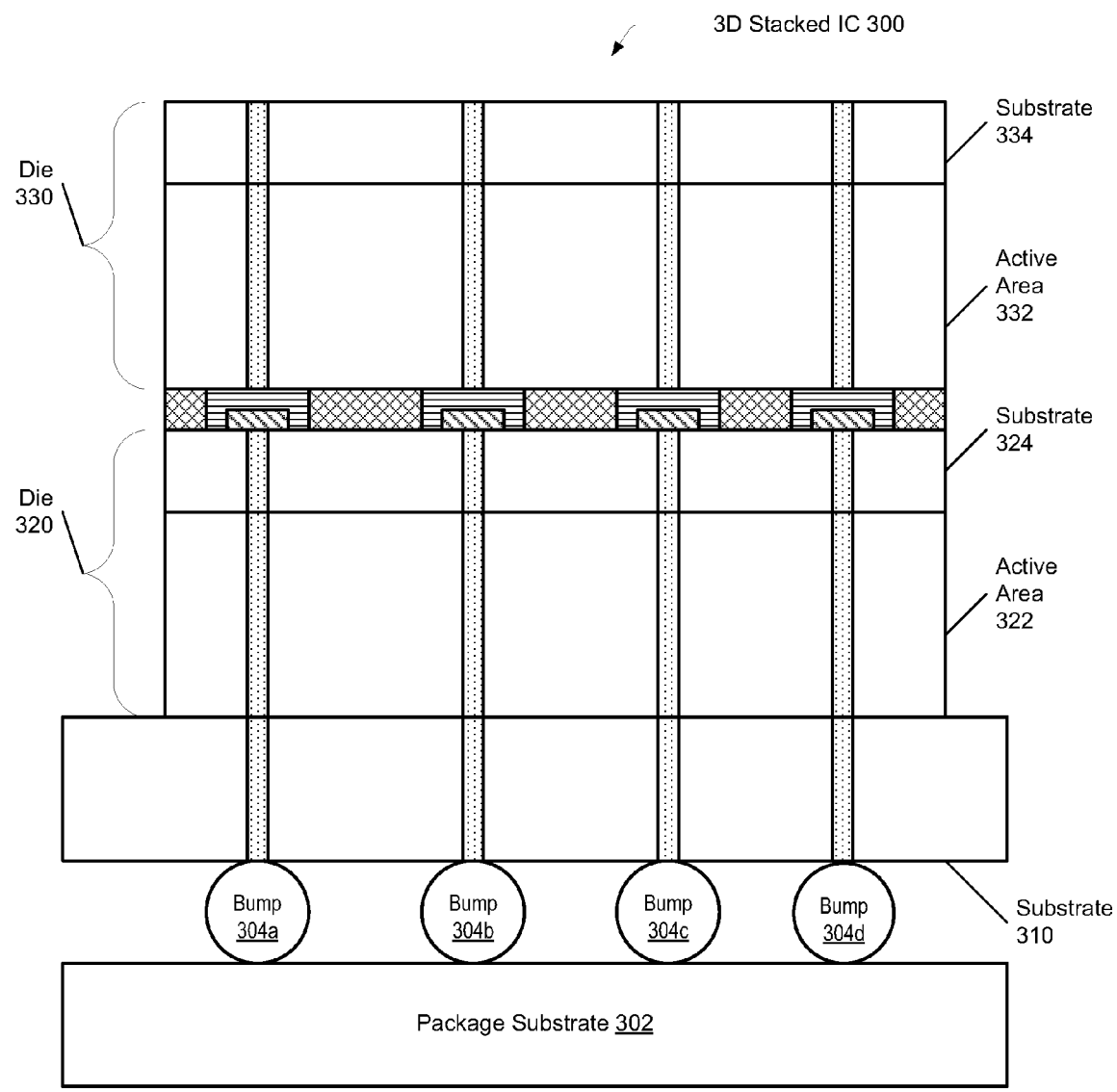
FIG. 3 is a generalized block diagram of yet another embodiment of a three-dimensional stacked integrated circuit (3D SIC).

Referring again to FIG. 1, in some embodiments of 3D SIC 100, the stacked dies 110-130 are wired together through regions of corresponding active areas using TSVs. In this case, the TSVs 128a-128f are the same as TSVs 138a-138f. Before continuing with a description of testing the 3D SIC 100, a further description of a 3D SIC utilizing TSVs without an interposer is provided. Turning now to FIG. 3, a generalized block diagram of one embodiment of a three-dimensional stacked integrated circuit (3D SIC) 300 utilizing TSVs without an interposer is shown. In various embodiments, a package substrate 302 is connected to a silicon substrate 310 through C4 bumps 304a-304d.

In the embodiment shown, the 3D SIC 300 comprises two dies 320 and 330. Although only two stacked dies are shown, another number of stacked dies may be selected. The dies 320 and 330 are flipped so that the active area 322 is below the substrate 324 within die 320. Similarly, the active area 332 is below the substrate 334 within die 330. Each of the C4 bumps 304a-304d has a respective TSV 318 routed straight up through the dies 320 and 330. In one embodiment, the die 330 is bonded to the die 320 with layers of adhesive 312. Solder 314 and a metal pad 316 may be used to electrically connect TSVs 318 within each of the dies 320 and 330. In some embodiments, the solder 314 may be micro bumps used between the dies 320 and 330.

Referring again to FIG. 1, additional dies may be stacked vertically on top of dies 110-130 and added horizontally to the dies 110-130 using at least the approaches described in FIG. 2 and FIG. 3. However, when dies are connected by TSVs, whether or not a silicon interposer is used, no external test access is provided. Additionally, the dies in a 3D package may not have test probe pads on them, since these dies may not be fabricated to be packaged individually. Further, the TSVs are typically larger than on-die routes resulting in expensive test pads even if these pads are provided. The test pads 126a-126b and 136a-136b may be used to bypass signals on the TSVs with the use of the muxes 124 and 134.

In various embodiments, an on-chip test and debug access port is used for testing the 3D SIC 100. In some embodiments, the IEEE 1149.1 standard Joint Test Action Group (JTAG) boundary scan architecture is used as an access solution. Other test and debug access solutions are possible and contemplated. Regardless of a selected access solution, such as JTAG or other boundary scan architectures, the base die may be the only die of the stacked dies with pins and possible probe pads. The base die is the only die connected to the printed circuit board.

Each of the stacked dies above the base die may be compatible with test and debug control and data signals used for the base die. For example, each of the stacked dies in the 3D SIC 100 may be compatible with the IEEE 1149.1 JTAG-based signals. The selected access solution may access the test access port (TAP) and the TAP controller of the base die as part of the methodology for accessing, configuring, controlling, and operating the test and debug logic within the 3D SIC 100. For the example using the IEEE 1149.1 JTAG-based signals, each of the stacked dies may support at least the signals test clock (TCK), test mode select (TMS), test data in (TDI), and test data out (TDO). Optional supported signals may include test reset (TRST), board-level test data input (BTDI), and board-level test data output (BTDO).

When the selected access solution includes a boundary scan architecture, the scan path operations may include a bypass operation that skips a given die of the stacked dies 110-130 without accessing any on-die functions of the given die. Another operation may include a turnaround operation that terminates a scan path at a given die and returns the scan path downward. A third operation may include an on-die access operation that accesses the test and debug logic contained within the given die. Yet another operation may include a next-die operation that accesses the test and debug logic on the die above this die while maintaining access to the current die.

Regardless of the particular selected access solution for testing and debugging, a method is utilized to adaptively assign a unique die address space ID to each die of the stacked dies 110-130 regardless of configuration. The die address space ID may be a subset of bits within a die address used to distinguish address space usage for the dies. For example, the most-significant six bits of a die address may be used to store a unique address space ID. These address space IDs may be simply referred to as IDs. The adaptive assignment of unique die IDs may be referred to as die enumeration.

The unique IDs may be used to avoid driver conflicts, since a broadcast bus may be used. A response only from a targeted die may be expected. Each die of the stacked dies 110-130 may be re-used in a different product configuration. Therefore, the die IDs may not be hardwired values, such as a value stored in configuration registers or "straps". The stacked dies may be "single-tower" stacks, where only a single die is stacked on top of another die. Alternatively, the stacked dies may also be "multi-tower" stacks where multiple dies are stacked on top of a single die.

When a product configuration uses a single-tower stack, the method for die enumeration may be simple. For example, the method may begin with a root ID for a base die. For each successive die going up the stack, the method may increment an ID of the immediately previous die in the stack relative to the given die. However, when a product configuration uses a multi-tower stack, the method for die enumeration may be complicated. The simple die ID enumeration method for single-tower stacks may not guarantee unique IDs for each die. The simple die ID enumeration method may not prevent address aliasing regardless of product configuration. In addition, the benefit of a more complicated die enumeration method and mechanism may be reduced if this method and mechanism utilizes an appreciable amount of hardware, a clock signal, and a hardwired strap.

Figure 4:
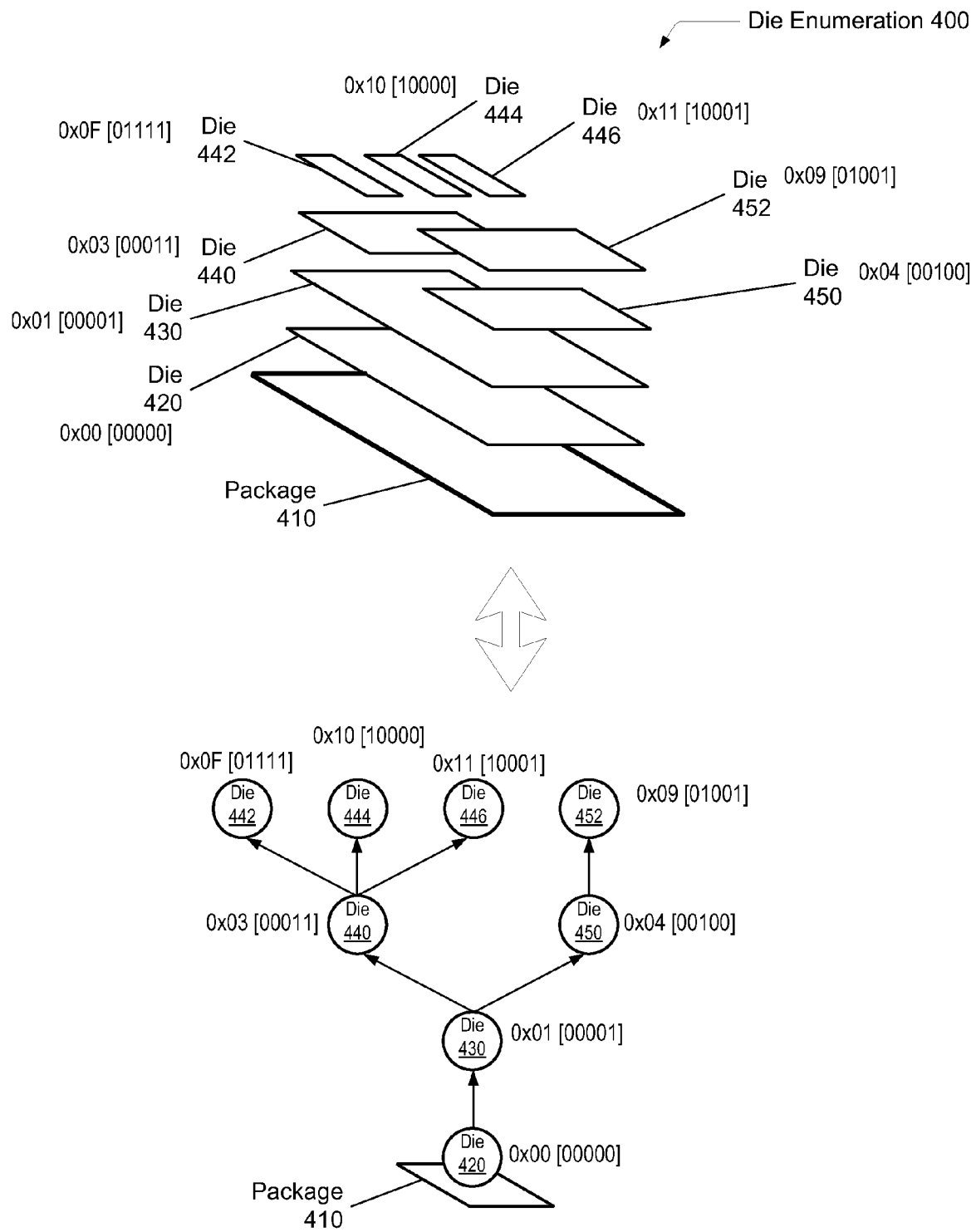
FIG. 4 is a generalized block diagram of one embodiment of unique die enumeration with no aliasing for a single-tower of stacked dies.

Turning now to FIG. 4, a generalized block diagram of one embodiment of a die enumeration 400 for a multi-stack configuration is shown. Two separate views representing the same die enumeration results is shown. A simplified die stack configuration and a tree-based representation are shown. The package 410 may represent a package substrate. The package 410 has a single die 420 placed on top of it. The die 420 has a single die 430 stacked on top of it. Any three-dimensional stacked integrated circuit (3D SIC) fabrication method may be used, such as the approaches described earlier.

The die 430 has two dies stacked on top of it. These dies are die 440 and die 450. The die 440 has three dies stacked on top of it—dies 442, 444 and 446. The die 450 has a single die, die 452, stacked on top of it. As shown, each of the dies 420-452 has an assigned 5-bit address space ID. In one embodiment, these 5 bits are the most-significant contiguous 5 bits of a die address. However, in other embodiments, another number of bits may be used and the bits may not be contiguous.

As shown in FIG. 4, each of the die IDs is a unique value. Therefore, address aliasing is prevented. In addition, the die IDs are not simply incremented values of each other. Die 420 has a hexadecimal value of 0x00 for its ID, wherein the "0x" is used to indicate a hexadecimal value. The die 430 has a die ID value 0x01. The dies 440 and 450 have ID values 0x03 and 0x04, respectively. The dies 442, 444 and 446 have ID values 0x0F, 0x10 and 0x11, respectively. Finally, the die 452 has an ID value 0x09. The die 420 may be assigned a root ID value and the remaining IDs for dies 430-452 may be generated from this root ID and other IDs.

Figure 5:
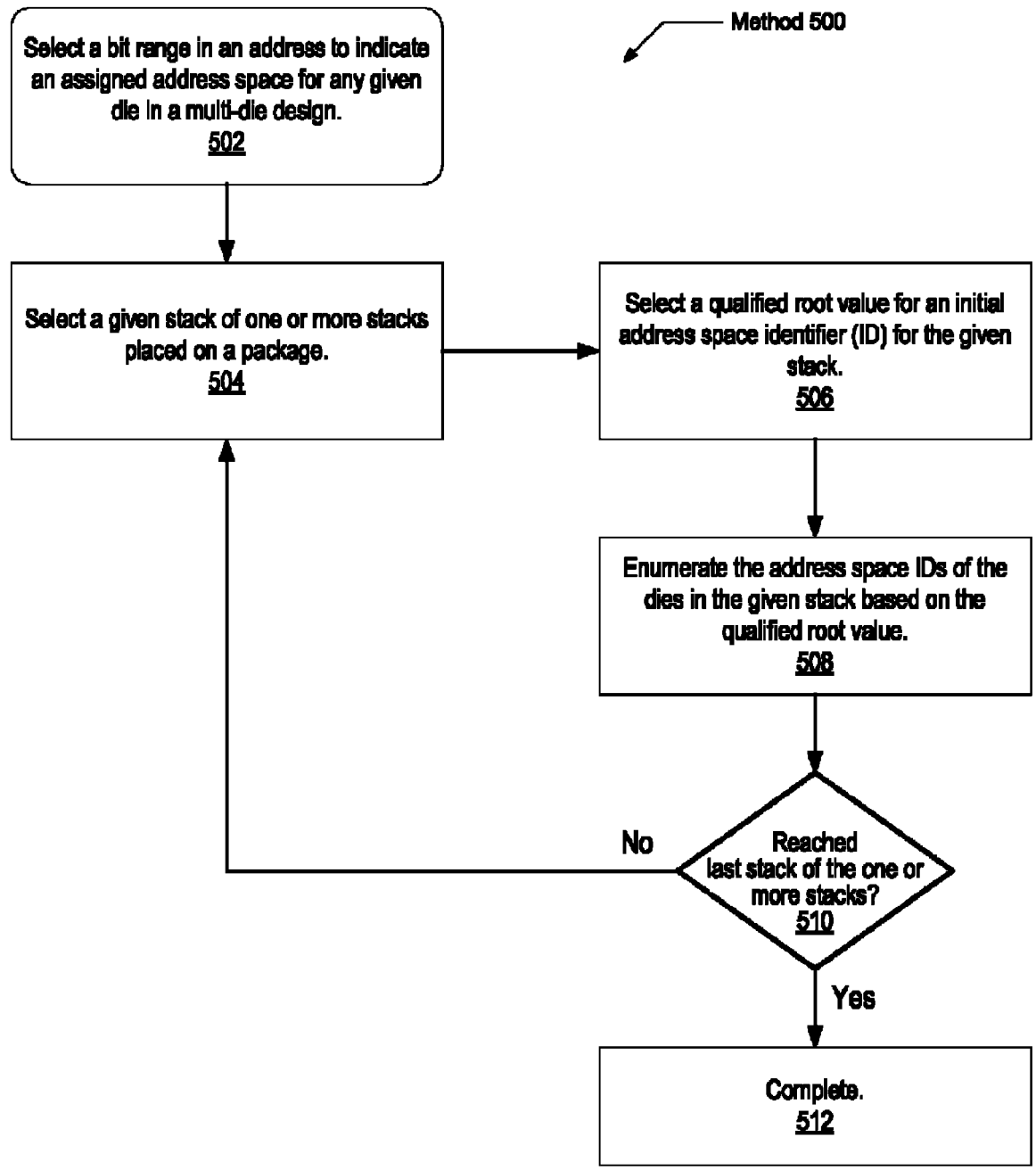
FIG. 5 is a generalized flow diagram of one embodiment of a method for efficient unique die enumeration with no aliasing.

Referring now to FIG. 5, a generalized flow diagram of one embodiment of a method 500 for unique die enumeration in a single-tower configuration is shown. For purposes of discussion, the steps in this embodiment and subsequent embodiments of methods described later are shown in sequential order. However, in other embodiments some steps may occur in a different order than shown, some steps may be performed concurrently, some steps may be combined with other steps, and some steps may be absent.

In block 502, a number of bits within a die address are selected to indicate an assigned address space for any given die in a multi-die design. In some embodiment, the number of bits is a contiguous bit range within the die address. In some embodiments, a number of selected contiguous bits are the most-significant number of bits of the die address. An amount of available memory and a number of dies within a tower of dies may be used to determine the number of bits to use.

In block 504, a given stack, or tower, of one or more stacks (towers) placed on a package may be selected. In block 506, a qualified root value for an initial address space identifier (ID) for the given stack is selected. This qualified root value may not be used in any other available stacks (towers) of the one or more stacks (towers).

In addition to the above, other qualifications may be used. For example, based on the derivation of unique IDs, particular unused IDs within a first tower may not be a qualified root value for a second tower. The reason is the derivation or algorithm used for the unique IDs may generate a previously assigned ID based on the particular unused ID if it is used as a root value. For example, referring again to FIG. 4, the ID value 0x07 is skipped in the die enumeration 400 and may not be a qualified root value for a second tower. However, the ID value 0x02 is skipped in the die enumeration 400 and it may be a qualified root value for a second tower. Further details of qualifications for a root value are provided shortly.

In block 508, the dies within the selected given stack are enumerated with unique address space IDs based on the qualified root value. In one embodiment, the die enumeration may occur during power up of the 3D SIC. The unique ID generation may trickle up the stack before any test and debug access occurs. In one embodiment, a first die beneath a second die to be enumerated generates the unique ID for the second die to be enumerated. Therefore, die enumeration logic may be included in each of the dies. In other embodiments, the die enumeration logic may be placed in selected dies. In such embodiments, the logic may receive indications of which dies and in what configurations these dies are used in order to generate unique IDs. The ID generation, or enumeration, may adaptively occur in order that no two IDs are the same in a particular product configuration. Referring again to FIG. 4, the die 410, which is beneath the die 420, may enumerate the die 420. Similarly, the die 420, which is beneath the die 430, may enumerate the die 430, and so forth.

In one embodiment, the first die that enumerates the second die may alter its own ID based on a number of dies stacked immediately on top of the first die. For example, in one embodiment the second die may shift its own ID value to create a new value. Other embodiments may use techniques other than shifting (or in addition to shifting) to form different IDs. By shifting more times, one or more ID values may be skipped. In one embodiment, the logic within the first die that performs the enumeration of the second die directly above it, may use the following algorithm:

1. $n = \text{ceil}(\log_2(S))$; // $n$ indicates the number of times to left shift and is based on $S$, which represents the number of dies placed directly on the current die
2. $\text{Next\_Die\_ID}[0] = \text{own\_ID} << n$; // Left shift and backfill with logic '1'
3. $\text{Next\_Die\_ID}[m_{(1...S-1)}] = \text{Next\_Die\_ID}[m-1] + 1$;

The algorithm uses a ceiling function. In mathematics and computer science, the ceiling function maps a real number to the smallest following integer. For a value "x", ceiling (x) or ceil (x) is the smallest integer not less than x. Referring again to FIG. 4, the die 420 has a qualified root value of 0x00. Logic within the die 420 may generate an ID for the die 430 by shifting its own ID of 0x00 by 1 and back filling with a logic high value (e.g., a value used to represent a binary "1"). Therefore, the die 430 has an ID value 0x01. Logic within the die 430 may generate an ID for the die 440 by shifting its own ID of 0x01 by 1 and back filling with a logic high value "1". Therefore, the die 440 has an ID value 0x03. The logic within the die 430 may generate an ID for the die 450 by incrementing the ID generated for the die 440. Therefore, the die 450 has an ID value 0x04.

Continuing with the above die enumeration example, logic within the die 440 may generate an ID for the die 442 by shifting its own ID of 0x03 by 2 and back filling with a logic high value "1". Therefore, the die 442 has an ID value 0x0F. The logic within the die 440 may generate an ID for the die 444 by incrementing the ID generated for the die 442. Therefore, the die 444 has an ID value 0x10. The logic within the die 440 may generate an ID for the die 446 by incrementing the ID generated for the die 444. Therefore, the die 446 has an ID value 0x11. Similarly, the logic within the die 450 may generate and ID for the die 452 by shifting its own ID of 0x04 by 1 and back filling with a logic high value "1". Therefore, the die 452 has an ID value 0x09. Although a left shift based on a number of dies placed immediately above a particular die is used above for generating unique die IDs, other shift amounts and binary logic operations may be used for determining the unique die IDs.

Returning to FIG. 5 and the method 500, if the last stack of the one or more stacks is not yet reached (conditional block 510), then control flow of method 500 returns to block 504. Otherwise, the die enumeration is complete. The method 500 and the algorithm described above uses minimal hardware, no clock signals, and no hardwired while preventing address aliasing regardless of product configuration.

Figure 6:
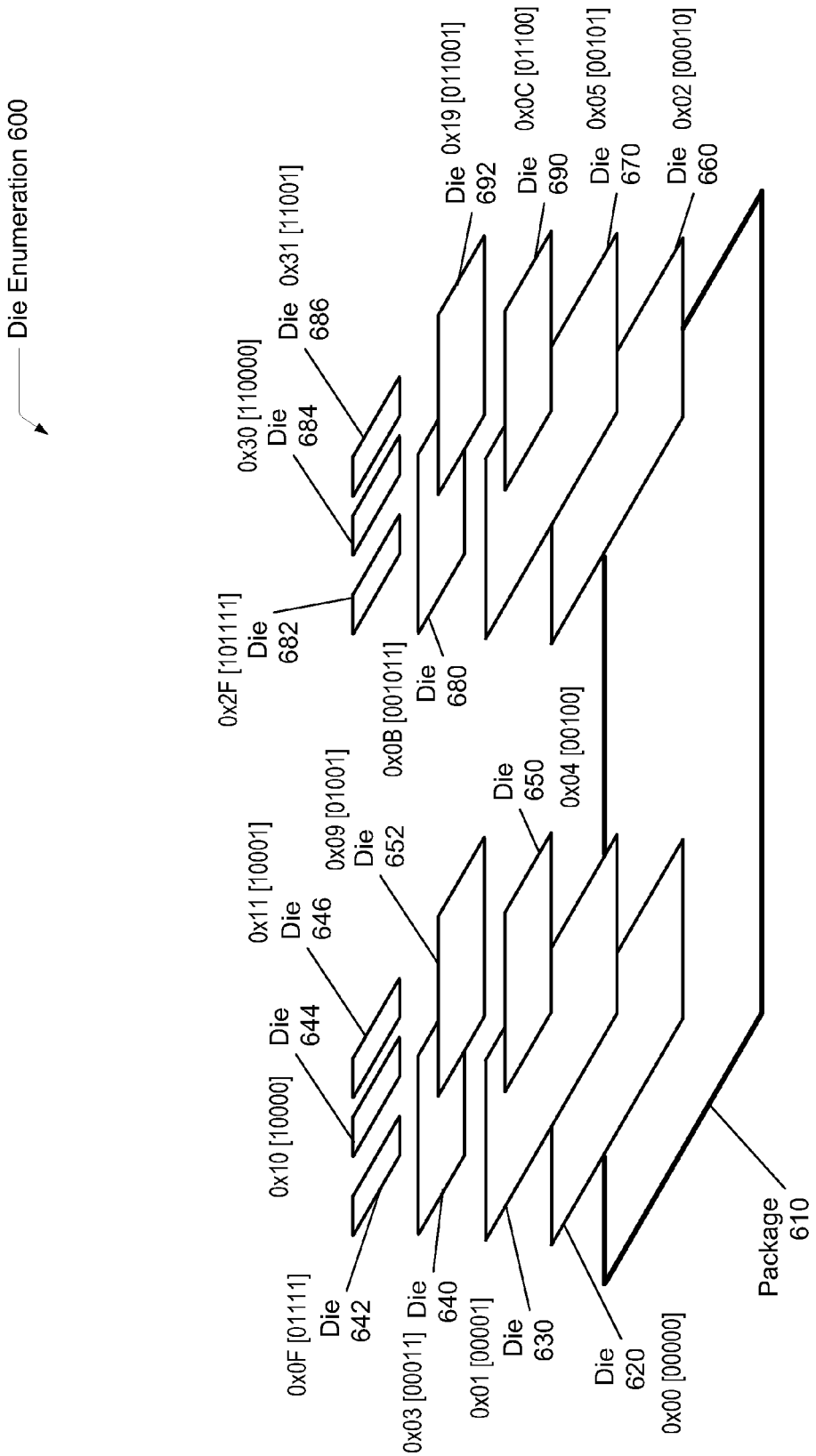
FIG. 6 is a generalized block diagram of one embodiment of unique die enumeration with no aliasing for a multi-tower stack of dies.
Figure 7:
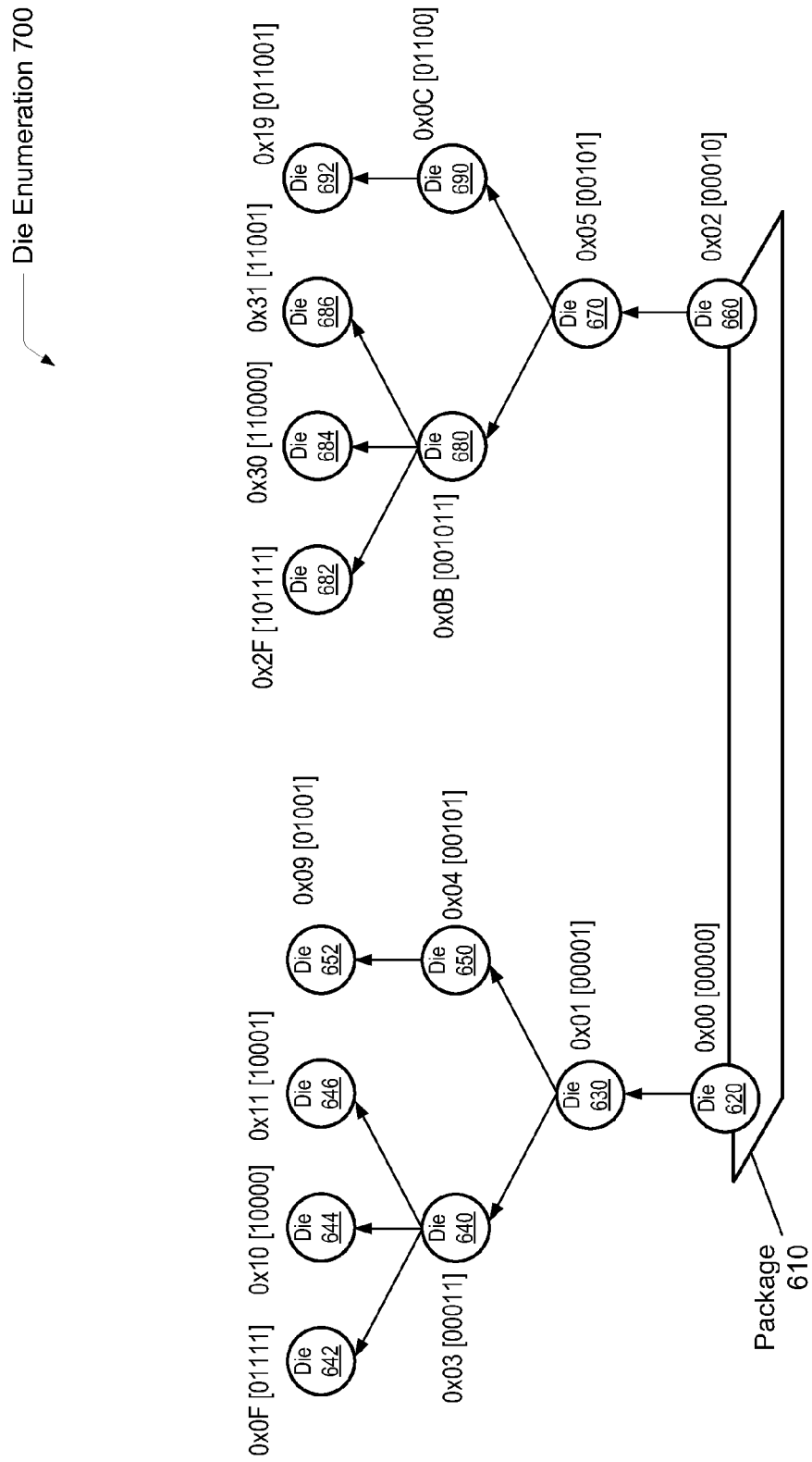
FIG. 7 is a generalized block diagram of the same embodiment of unique die enumeration with no aliasing for a multi-tower stack of dies in the form of a tree.

Referring now to each of FIG. 6 and FIG. 7, generalized block diagrams illustrating two different views of the same die enumeration for a multi-tower stack is shown. A simplified die stack configuration is shown in FIG. 6 and a corresponding tree-based representation is shown in FIG. 7. As shown for die enumeration 600, the package 610 may represent a package substrate. The package 610 has two dies placed on top of it. The die 620 and the die 660 are each placed on the package 610. The die 620 has a single die 630 stacked on top of it. The die 660 has a single die 670 placed on top of it. The die enumeration 700 illustrates an alternate view of this stacking configuration. Any three-dimensional stacked integrated circuit (3D SIC) fabrication method may be used, such as the approaches described earlier.

The dies 620-652 may be enumerated in a similar manner as described above for method 500 and the illustrated algorithm. In the example shown, the stacking configuration for the dies 620-652 is the same as for the dies 420-452 described earlier. Therefore, the same unique IDs are generated when a same root value, such as 0x00, is used. Similarly, the dies 660-692 may be enumerated with the same algorithm, but with a different root value, such as 0x02.

Here, the stack with the dies 620-652 may be referred to as a first stack. Similarly, the stack with the dies 660-692 may be referred to as a second stack. The first stack has a qualified root value of 0x00 to use for an ID for the die 620. The second stack has a qualified root value of 0x02 to use for an ID for the die 660. In one embodiment, the root values are generated by logic outside of the stacks and sent to the base dies 620 and 660. In another embodiment, the dies 620 and 660 detect they are base dies and select the root values. A base die may be a die that is assigned an initial unique die ID that is used to generate other unique die IDs within a given tower of stacked dies. In one embodiment, the base die is a die located at the bottom of the tower and connected to the package substrate.

The root value 0x02 may be chosen since it is not used in the first stack. Additionally, the root value 0x02 is not a skipped ID value. In a multi-tower configuration, a qualified root value may be selected such that the root value does not alias with any other die on a previously placed stack. A skipped ID may generate IDs that alias with other dies on previously placed stacks.

An ID value may be considered "skipped" when the ID enumeration algorithm shifts more than once to enumerate a first die on top of any single die. In the above examples, the dies 440 and 640 have 3 dies placed on top of it. Therefore, the die enumeration algorithm shifts twice to enumerate the dies 442 and 642, respectively. The ID value 0x07 was "skipped" to produce the resulting ID value 0x0F for the dies 442 and 642.

The above algorithm for enumerating unique IDs works similar to an upside down tree, though not exactly a binary tree. Each node in a binary tree has only two child nodes. In the case of die stacking, a stacked die configuration may not be limited to having only two die stacked on top of any single die. By shifting an ID value more than once, levels within the binary tree are effectively skipped. By increasing the number of bits used to represent a die address space ID, the die enumeration algorithm may be extended to any number of levels. For example, if a fabrication process allowed it, the second stack beginning with the die 660 could be placed on top of the die 652 and no address aliasing would occur.

Figure 8:
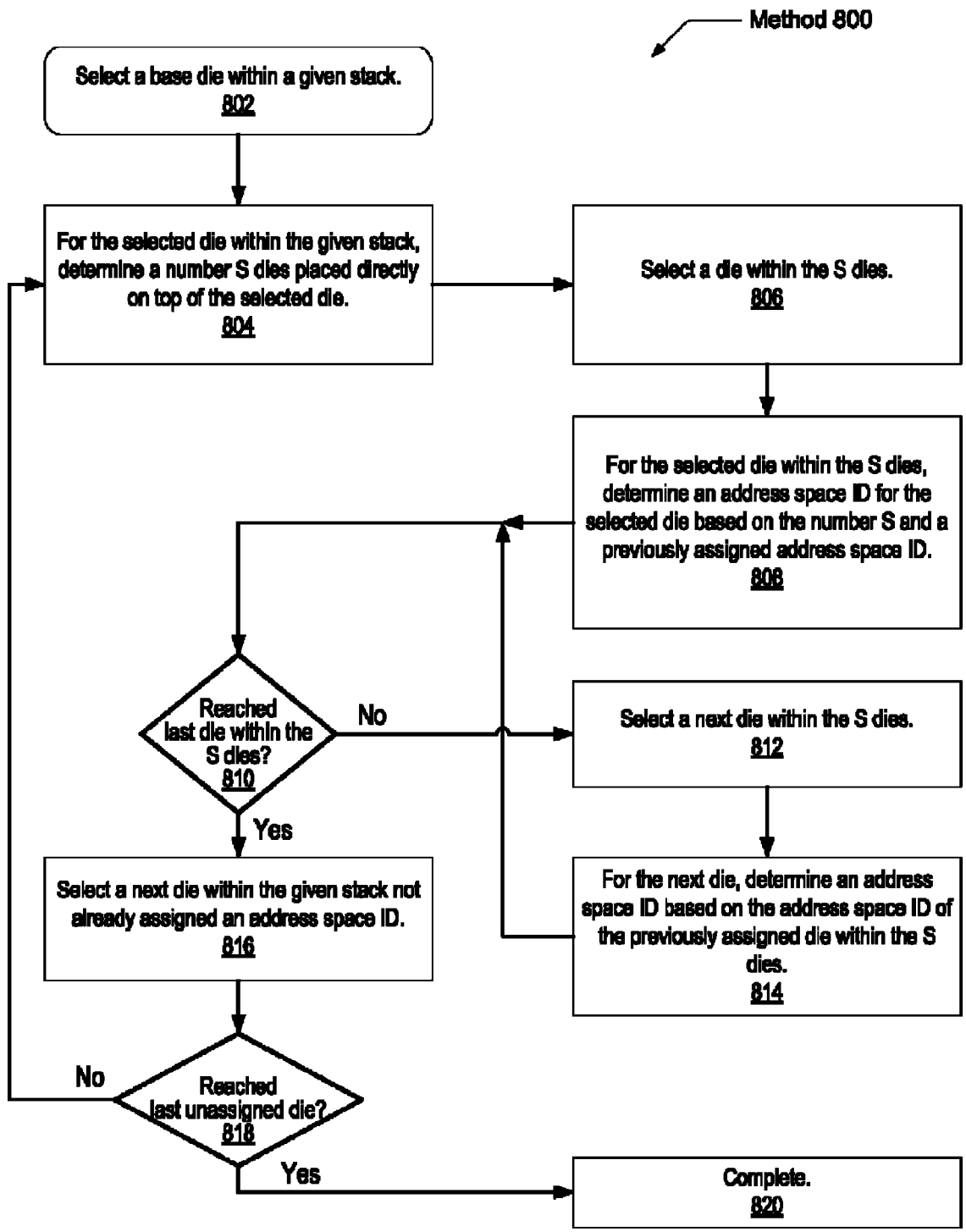
FIG. 8 is a generalized flow diagram of another embodiment of a method for efficient unique die enumeration with no aliasing.

Referring now to FIG. 8, a generalized flow diagram of one embodiment of a method 800 for unique die enumeration in a multi-tower configuration is shown. For purposes of discussion, the steps in this embodiment and subsequent embodiments of methods described later are shown in sequential order. However, in other embodiments some steps may occur in a different order than shown, some steps may be performed concurrently, some steps may be combined with other steps, and some steps may be absent.

In block 802, a die is selected within a given stack. A base die may be the first die to enumerate within the given stack. In one embodiment, the base die is the bottom die within the given stack selected for beginning a die enumeration process for the given stack. In block 804, a number S dies placed directly on top of the selected die is determined. In block 806, a die within the S dies is selected. In block 808, an address space ID for the selected die is determined based on the number S and a previously assigned address space ID. For example, the shift and backfill steps of the earlier algorithm may be used.

If the last die within the S dies is not reached (conditional block 810), then in block 812, a next die within the S dies is selected. In block 814, for this next die, an address space ID is determined based on the address space ID of the previously assigned die within the S dies. For example, the ID of the previously assigned die within the S dies may be incremented as done in the earlier algorithm. However, other operations may be performed on the most recent previously assigned die ID to determine a current die ID. Afterward, control flow of method 800 returns to conditional block 810.

If the last die within the S dies is reached (conditional block 810), then in block 816, a next die is selected within the given stack that is not already assigned an address spaced ID. In one embodiment, a die placed in a next immediately above "level" of the "tree" is selected. For example, referring again to FIG. 6, after die 630 is enumerated, either die 640 or die 650 may be selected next, rather than die 642. In one embodiment, the die enumeration process may trickle upward from the base die one level at a time. If the last unassigned die has already been selected and enumerated (conditional block 818), then in block 820, the die enumeration process for the given stack is complete. Otherwise, control flow of method 800 then returns to block 804.

Figure 9:
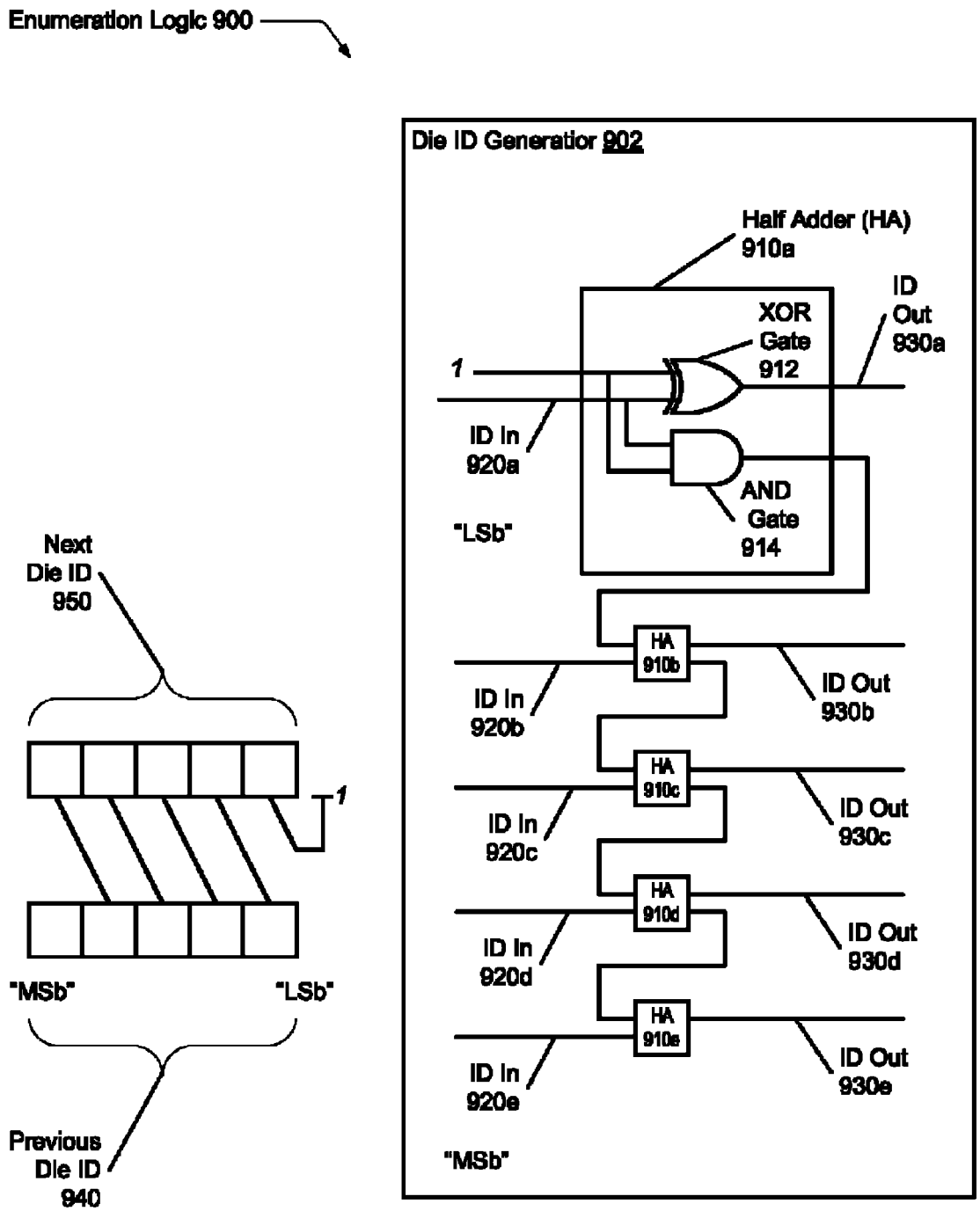
FIG. 9 is a generalized block diagram of one embodiment of die enumeration logic.

Turning now to FIG. 9, a generalized block diagram of one embodiment of enumeration logic 900 is shown. In the embodiment shown, the die IDs include 5 bits. However, another number of bits may be chosen for other embodiments. The logic 900 may be used for the algorithm described earlier for producing unique die IDs. The logic 900 my not use a clock signal or a flip-flop circuit. The boxes within the logic 902 are half adders, rather than flops or registers.

The shift operation with the backfills of logic high values may be performed by the logic 900 by, first, assigning a bit over by the appropriate amount, such as n=ceil ($\log_2(S)$) as described earlier. The "moving" of a previous ID's bit values may be performed by wires or multiplexers (not shown). The least-significant bit(s) may be connected to a logic high value. The Previous Die ID 940 may be shifted and backfilled with logic high values to produce the Next Die ID 950. To enumerate additional die stacked on top of Die 940, the Next Die ID 950 may be sent to a string of half adders.

The addition operation (increment) may be performed by the logic 900 with a string of half adders. The die ID generation logic 902 includes half adders 910a-910e. The half adders 910a-910e receive the input values ID In 920a-920e for the logic 902. These inputs may be an ID value of a previous die ID stacked at the same level. The received values ID in 920a-920e may be the output values of a previous die ID. The half adders 910a-910e produce the output signals ID Out 930a-930e.

The adder logic may be further optimized as the half adder 910a for the least-significant bit (LSb) has a logic high value added to it. Therefore, the exclusive-OR (XOR) gate 912 may be replaced with an inverter. Additionally, the half adder 902e for the most-significant bit (MSb) may not use a carry out value. Therefore, the logic AND gate 914 may be removed from the half adder 910e.

It is noted that the above-described embodiments may comprise software. In such an embodiment, the program instructions that implement the methods and/or mechanisms may be conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium may include any storage media accessible by a computer during use to provide instructions and/or data to the computer. For example, a computer accessible storage medium may include storage media such as magnetic or optical media, e.g., disk (fixed or removable), tape, CD-ROM, or DVD-ROM, CD-R, CD-RW, DVD-R, DVD-RW, or Blu-Ray. Storage media may further include volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media may include microelectromechanical systems (MEMS), as well as storage media accessible via a communication medium such as a network and/or a wireless link.

Additionally, program instructions may comprise behavioral-level description or register-transfer level (RTL) descriptions of the hardware functionality in a high level programming language such as C, or a design language (HDL) such as Verilog, VHDL, or database format such as GDS II stream format (GDSII). In some cases the description may be read by a synthesis tool, which may synthesize the description to produce a netlist comprising a list of gates from a synthesis library. The netlist comprises a set of gates, which also represent the functionality of the hardware comprising the system. The netlist may then be placed and routed to produce a data set describing geometric shapes to be applied to masks. The masks may then be used in various semiconductor fabrication steps to produce a semiconductor circuit or circuits corresponding to the system. Alternatively, the instructions on the computer accessible storage medium may be the netlist (with or without the synthesis library) or the data set, as desired. Additionally, the instructions may be utilized for purposes of emulation by a hardware based type emulator from such vendors as Cadence®, EVE®, and Mentor Graphics®.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A stacked integrated circuit comprising:
   a plurality of dies wherein at least two dies of the plurality of dies are vertically stacked and at least one given die of the plurality of dies comprises die enumeration logic;
   wherein said logic is configured to:
   receive a first die identifier (ID) from a first die of the plurality of dies placed below the given die;
   alter the received first die ID based on a number of dies placed above the given die in order to generate a second die ID; and
   send the second die ID to a second die of the plurality of dies placed above the given die;
   wherein in response to detecting the given die is not a base die of a multi-tower stacked die configuration, the logic is further configured to receive the first die ID from a die placed immediately below the given die which also generated the first die ID.

2. The stacked integrated circuit as recited in claim 1, wherein to alter the received first die ID, the logic is configured to shift the received first die ID, and wherein to generate the second die ID the logic is further configured to back fill the shifted first die ID with a logic high value.

3. The stacked integrated circuit as recited in claim 1, wherein in response to detecting said number of dies is greater than one, the logic is further configured to increment the second die ID to generate a third die ID to send to a third die of the plurality of dies placed above the given die, wherein the third die is different from the second die.

4. The stacked integrated circuit as recited in claim 3, wherein the logic is further configured to increment a previously generated die ID to generate an additional die ID for each successive one of said number of dies not corresponding to the second or the third die ID.

5. The stacked integrated circuit as recited in claim 1, wherein in response to detecting the given die is the base die, the logic is further configured to select a root value and use the root value as the first die ID, wherein the root value is distinct from any die ID previously assigned to other dies of the plurality of dies.

6. The stacked integrated circuit as recited in claim 5, wherein the logic is further configured to select the root value such that the root value is not a skipped ID, wherein the skipped ID is an ID bypassed for assignment responsive to detecting a corresponding shift amount is greater than one.

7. The stacked integrated circuit as recited in claim 3, wherein each of the first die ID, the second die ID, and the third die ID is distinct from any other die ID assigned to other dies of the plurality of dies.

8. A method for die enumeration of stacked dies comprising:
   receiving a first die identifier (ID) from a first die of a plurality of dies placed below a given die of the plurality of dies;
   altering the received first die ID based on a number of dies placed above the given die in order to generate a second die ID; and
   sending the second die ID to a second die of the plurality of dies placed above the given die;
   wherein in response to detecting the given die is not a base die, the method further comprises receiving the first die ID from a die placed below the given die which also generated the first die ID.

9. The method as recited in claim 8, wherein altering the received first die ID comprises shifting the received first ID, and to generate the second die ID the method further comprises back filling the shifted first die ID with a logic high value.

10. The method as recited in claim 8, wherein in response to detecting said number of dies is greater than one, the method further comprises incrementing the second die ID to generate a third die ID to send to a third die of the plurality of dies placed above the given die, wherein the third die is different from the second die.

11. The method as recited in claim 10, further comprising incrementing a previously generated die ID to generate an additional die ID for each successive one of said number of dies not corresponding to the second or the third die ID.

12. The method as recited in claim 8, wherein in response to detecting the given die is the base die, the method further comprises selecting a root value and using the root value as the first die ID, wherein the root value is at least distinct from any die ID previously assigned to other dies of the plurality of dies.

13. The method as recited in claim 12, further comprising selecting the root value such that the root value is not a skipped ID, wherein the skipped ID is an ID bypassed for assignment in response to a corresponding shift amount is greater than one.

14. The method as recited in claim 8, wherein the shift amount is based on a mathematical ceiling of a logarithmic value of said number of dies.

15. A semiconductor die included in a multi-die stacked configuration comprising:

a first interface to a first die placed below itself;
a second interface to a second die placed above itself; and
control logic configured to:
  receive a first die identifier (ID) from the first die;
  alter the received first die ID based on a number of dies placed above itself in order to generate a second die ID; and
  send the second die ID to the second die;
wherein in response to detecting the semiconductor die is a base die, the logic is further configured to select a root value and use the root value as the first die ID such that the root value does not correspond to a skipped ID.

16. The die as recited in claim 15, wherein to alter the received first die ID, the logic is configured to shift the received first die ID, and wherein to generate the second die ID the logic is further configured to back fill the shifted first die ID with a logic high value.

17. The die as recited in claim 15, wherein in response to detecting said number of dies is greater than one, the logic is further configured to increment the second die ID to generate a third die ID to send to a third die placed above itself, wherein the third die is different from the second die.

* * * * *